United States Patent [19]

Marinelli et al.

[11] Patent Number: 5,465,050
[45] Date of Patent: Nov. 7, 1995

[54] DYNAMIC RANGE TESTER

[75] Inventors: Anne M. P. Marinelli, Laurel; Michael S. Patterson, Olney, both of Md.

[73] Assignee: The United States of America as represented by the Secretary of the Army, Washington, D.C.

[21] Appl. No.: 275,692

[22] Filed: Jul. 13, 1994

[51] Int. Cl.$^6$ .................................................. G01R 17/04
[52] U.S. Cl. ........................ 324/603; 324/626; 324/620; 324/612; 330/2; 331/78
[58] Field of Search ................................. 331/78; 330/2; 324/624, 623, 626, 603, 613, 620, 612

[56] References Cited

U.S. PATENT DOCUMENTS

| | | | |
|---|---|---|---|
| 2,773,186 | 12/1956 | Herrmann | 331/78 |
| 2,987,586 | 6/1961 | Berger | 324/624 |
| 3,517,168 | 6/1970 | McCarthy | 331/78 |
| 3,731,186 | 5/1973 | Sadel | 331/78 |
| 4,028,622 | 6/1977 | Evans | 331/78 |

Primary Examiner—Kenneth A. Wieder
Assistant Examiner—Jose M. Solis
Attorney, Agent, or Firm—Freda L. Krosnick; Frank J. Dynda

[57] ABSTRACT

A dynamic range tester which simultaneously generates two signals, each of which is composed of a clean signal plus an excess quantity of independent and isolated random noise is disclosed for use in producing real world signals which can be used to provide a simulated operating environment within which to evaluate the dynamic range or evaluate the processing gain of an electronic or acousto-optic system. The power level of the signal and power level of the noise in each of the two outputs of the dynamic range tester can be independently varied such that a range of signal-to-noise ratios may be set-up in each output.

8 Claims, 4 Drawing Sheets

5,465,050

DYNAMIC RANGE TESTER

BACKGROUND OF THE INVENTION

The present invention relates generally to apparatus for determining various parameters of an acousto-optic (AO) or radio frequency (RF) system. More particularly, the present invention is directed to a calibrated signal-to-noise ratio (S/N) generator that can be used to evaluate the dynamic range and processing gain of a system.

In the testing of various acousto-optic or radio frequency systems, it is frequently desired to provide a simulated operating environment within which to evaluate the dynamic range or processing gain or both of the electronic system. In order to accurately evaluate such a dynamic range or processing gain in a laboratory environment, it is necessary to simulate two "real-world" signals and apply them simultaneously to the system under test. These "real world" signals are composed of a clean signal and a noise signal. The power levels of these two signals are independently adjusted to determine the greatest range between maximum and minimum power that the system can simultaneously process. Such a testing technique enables the user to test the response of an acousto-optic or RF system to real signal without leaving the laboratory.

It is also useful to be able to determine the processing gain of an acousto-optic correlator, that is, how far below the noise level the correlator can detect a common RF signal in both of its inputs. Such processing gain can be thought of as the dynamic range in the presence of excess noise. In addition, it would be useful to be able to determine the frequency resolution of such an acousto-optic correlator.

SUMMARY AND OBJECTS OF THE INVENTION

In view of the foregoing, it should be apparent that there exists a need in the art for a system for simultaneously producing two "real-world" signals which can be used to provide a simulated operating environment within which to evaluate the dynamic range of an electronic system. It is, therefore, a primary object of this invention to provide apparatus for generating two such signals simultaneously, each signal being composed of a clean signal plus an excess quantity of independent random noise, which can be used to determine the difference between maximum and minimum signals that an electronic system under test can process.

More particularly, it is an object of this invention to provide a system which may be used to determine the processing gain of an acousto-optic correlator as well as the frequency resolution of such an acousto-optic correlator by means of processing two different frequency signals.

Still more particularly, it is an object of the present invention to provide apparatus useful for testing various parameters of an acousto-optic or RF system in a laboratory environment in which two separate real signals are generated simultaneously and applied to the system under test.

Another object of the present invention is to provide a calibrated signal-to-noise ratio generated as aforementioned using apparatus having simple and reliable electronic circuitry which does not require frequent alignment nor costly components.

Briefly described, these and other objects of the invention are accomplished by providing an apparatus which simultaneously generates two signal channels, each of which is composed of a clean signal plus an excess quantity of random noise which is isolated and uncorrelated from the random noise in the other channel. The power level of the signal and noise in each of the two outputs of the dynamic range tester of the present invention can be independently varied such that a range of signal-to-noise ratios may be set up in each output. Two filter banks are provided, one in each channel of the dynamic range tester of the present invention, which allow the user to select the frequency range corresponding to the system or device under test.

The dynamic range tester of the present invention enables the user to simulate two separate real signals in a laboratory environment. Those signals can be used to provide a simulation of two separate receiving antennas. The dynamic range tester of the present invention can also be configured to simulate antennas which are receiving the same or differing signals. In that manner, the user may test the response of an acousto-optic or RF system to real-signals in a laboratory. In addition, the frequency resolution of an acoustooptic correlator may also be determined by the dynamic range tester of the present invention by processing two different frequency signals, one through each channel of the dynamic range tester.

With these and other objects, advantages and features of the invention that may become hereinafter apparent, the nature of the invention may be more clearly understood by reference to the following detailed description of the invention, the appended claims and to the several drawings attached herein.

DETAILED DESCRIPTION OF THE PREFERRED EMBODIMENT

Figure 1:
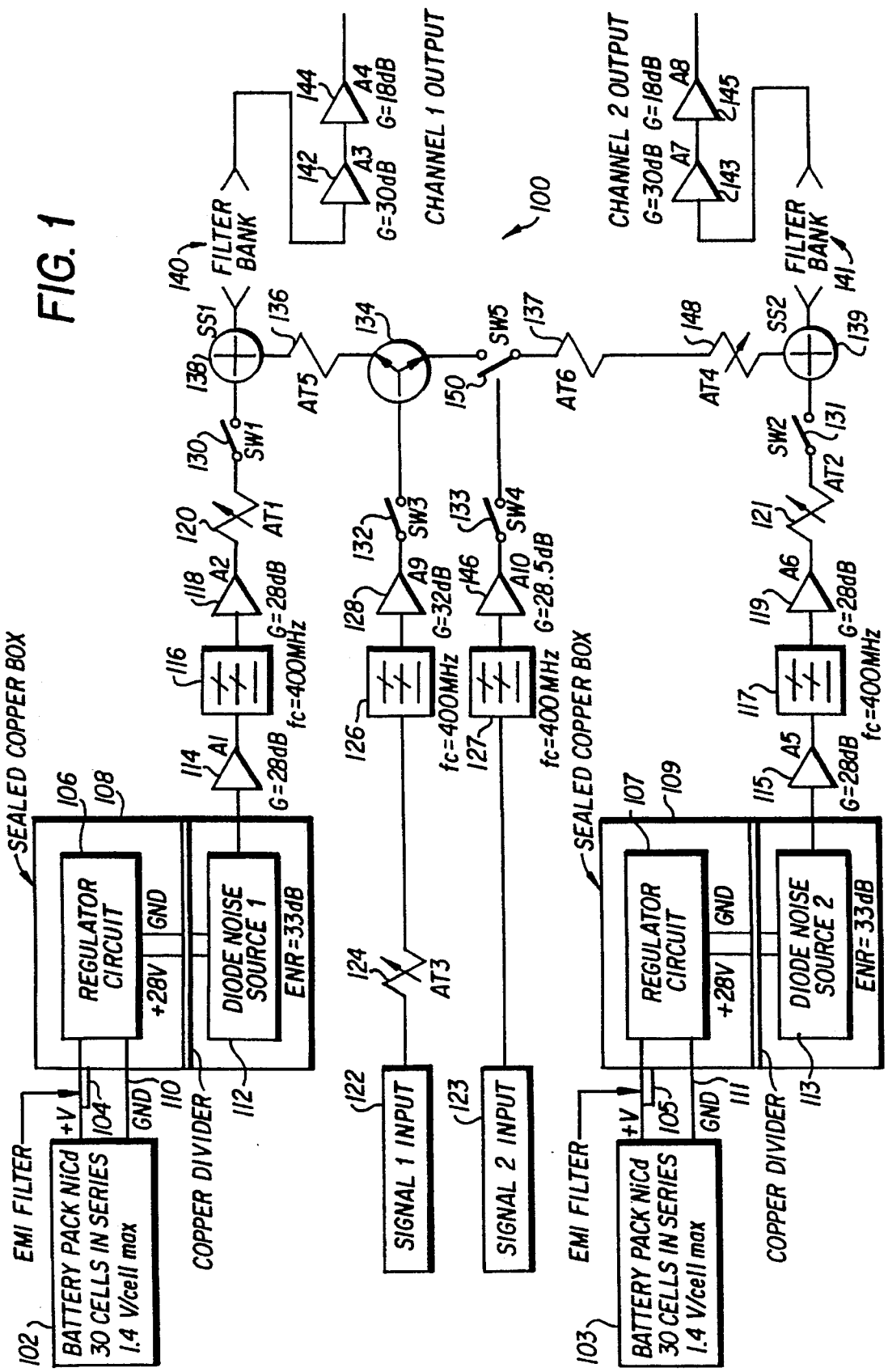
FIG. 1 is a schematic block diagram showing the circuitry which forms the dynamic range tester of the present invention.

Referring now in detail to the drawings wherein like parts are designated by like reference numerals throughout, there is illustrated in FIG. 1 an electrical schematic block diagram of the dynamic range tester system 100 of the present invention. The dynamic range tester 100 is provided with two output channels so that the power level of the signal and the noise in each of those two channels can be independently varied such that a range of signal-to-noise ratios may be generated in each output. In addition, two filter banks, one in each of the channels of the dynamic range tester 100, are utilized, which enable the user to select the frequency range corresponding to the device under test. The dynamic range tester 100 of the present invention is preferably constructed such that any frequency range within the 30 MHz–400 MHz system range may be selected.

More specifically, the dynamic range tester system 100 of the present invention includes a battery pack 102 which preferable utilizes 30 NiCd cells connected in series such that a maximum of 42.0 volts is achieved. The battery pack 102 is connected through a regulator circuit 106 to operate the noise source 112 of channel 1 of the dynamic range tester 100. An identical battery pack 103 is connected through the regulator circuit 107 to operate the noise source 113 of channel 2 of the dynamic range tester 100. A comparator circuit (not shown) is connected to monitor the outputs of both of the battery packs 102, 103. When the output from either of the two battery packs 102, 103 falls below 31 volts, a "recharge necessary" light (not shown) is illuminated on the dynamic range tester 100. The dynamic range tester 100 also includes constant current recharge circuitry (not shown) for recharging each of the battery packs 102, 103.

Each of the battery packs 102, 103 is connected to deliver its output voltage through a respective EMI filter 104, 105 to the regulator circuit 106, 107 of the noise sources 112, 113 in the dynamic range tester 100. Each of the regulator circuits 106, 107 is contained within a sealed copper box 108, 109 to which the respective battery pack 102, 103 is connected by means of a positive lead and a ground lead 110, 111. In addition to the regulator circuits 106, 107, each of the sealed copper boxes 108, 109 also includes a diode noise source 112, 113 which receives a +28 volt input from its respective regulator circuit 106, 107. Also, each of the diode noise sources 112, 113 is connected by means of a positive lead and a ground lead to its respective regulator circuit 106, 107.

The two separate channels of random independent noise signals generated by the dynamic range tester 100 are generated by using the two separate diode noise sources 112, 113, which may preferably be model No. NC3201C available from Noise-Com of Hackensack, N.J.

Each of the diode noise sources 112, 113 is powered by its own rechargeable battery supply 102, 103, which supplies power to each respective diode noise source 112, 113 through its own voltage regulator circuit 106, 107. Each sealed copper box 108, 109, which contains the respective regulator circuits 106, 107 and diode noise sources 112, 113, is equipped with an EMI filter 104, 105 mounted on one wall of the box which provides the connecting point for each corresponding battery supply 102, 103. In addition, each of the copper boxes 108, 109 has an SMA connector output at which the level of the noise generated is equal to kTB plus the Excessive Noise Ratio (ENR) of the diode noise source. Preferably, the ENR of each diode noise source is 33 dB. The bandwidth of the noise at the SMA connector output (not shown) of each of the sealed copper boxes 108, 109 is preferably greater than 1 GHz.

Connected to each of the diode noise sources 112, 113 are respective amplifiers 114, 115, having a conductance gain of preferably 28 dB. The output of each of the amplifiers 114, 115 is respectively connected to a low pass filter 116, 117 having a frequency cut-off of preferably 400 MHz in order to limit the bandwidth of the noise which is processed through the dynamic range tester 100 to the desired range.

A second set of amplifiers 118, 119 is connected to receive the output from each of the respective low pass filters 116, 117. These amplifiers 118, 119 preferably have the same characteristics as the amplifiers 114, 115. The output of each of the second set of amplifiers 118, 119 is connected to first and second variable attenuators 120, 121, which are used to select the desired noise level for each of the output channels. The desired maximum noise level in each of the output channels, with a designed minimum bandwidth of 20 MHz is +30 dBm, which is 1 watt.

In order to inject a signal into the dynamic range tester 100, two signal input ports 122, 123 are provided. The signal 1 input circuitry includes a variable attenuator 124 whose output is connected to a low pass filter 126 having the same characteristics as the low pass filters 116, 117. The output from the low pass filter 126 is fed to an amplifier 128 which generates a gain of preferably 32 dB from its input to its output. A switch 132 is provided for switching the thus processed signal 1 input into the dynamic range tester 100. The switch 132 is connected between the output of the amplifier 128 and a signal splitter 134 which splits the thus processed signal 1 input into two signals, one for each of the output channels of the dynamic range tester 100.

One output of the signal splitter 134 is connected through an attenuator 136 of preferably 20 dB to an adding device 138 which functions to add the processed noise signal generated for channel one of the dynamic range tester to the processed first signal. The output from the adder device 138 is filtered by a filter chosen from a bank of filters 140 or by a filter externally connected to the bank in order to select the bandwidth of the output signal and it is then amplified by the amplifiers 142 and 144, preferably having gains of 30 and 18 dB, respectively.

The remaining output of the signal splitter 134 can be connected to channel two of the dynamic range tester through the switch 150. This setting of switch 150 configures the dynamic range tester to carry the processed signal 1 input 122 to both output channels. Alternately, the switch 150 may be set to connect to the processed signal 2 input and to thus configure the dynamic range tester to carry the signal 1 input to the channel one output and the signal 2 input to the channel two output. The details of that configuration follow.

The signal 2 input 123 is connected to a low pass filter 127 having the same characteristics as the low pass filter 126. The output from the low pass filter 127 is fed to an amplifier 146 whose output preferably has a gain of 28.5 dB over its input. The output from the amplifier 146 is connected to a switch 133 for switching the second signal in and out of the dynamic range tester. The outputs from the switch 133 and the signal splitter 134 are connected respectively to the two inputs of the switch 150, which allows the user to control whether the processed signal 1 input or signal 2 input signals are input to the channel two circuitry of the dynamic range tester 100 of the present invention. The output from the switch 150 is connected to an attenuator 137 having the same characteristics of the attenuator 136. The output from the attenuator 137 is connected to a variable attenuator 148 which allows the user to adjust the level of the signal to be input, by means of a second adder device 139, to the channel two output circuitry. The attenuator 148 allows the user to vary the signal level in the output channel two independently of the signal level in channel one.

As discussed above, the second diode noise source 113 is connected through an amplifier 115 and a low pass filter 117 to the input of another amplifier 119. Each of the devices 115, 117 and 119 has the same characteristics as their respective devices 114, 116 and 118 described in connection with the circuitry of channel one of the dynamic range tester 100. Likewise, the output from the amplifier 119 is connected to a variable attenuator 121 whose output is connected to the input of the switch 131. Again, both of those devices 121 and 131 have the same characteristics as their counterparts 120, 130 in the channel one circuitry.

The output from the switch 131 is connected to a second input of the adder device 139, such that the processed second noise signal and the processed first or second input signal are added together. The output from the adding device 139 is connected to a bank of filters 141 whose output is connected to the input of an amplifier 143 whose output is connected to the input of a second amplifier 145. Each of the devices 141,143 and 145 have the same characteristics as their counterpart devices 140, 142, 144 in channel one of the dynamic range tester 100.

As discussed above, the maximum generated noise level in each of the output channels one and two of the dynamic range tester 100 of the present invention, given a minimum bandwidth of 20 MHz, is 1 watt or +30 dBm. The maximum signal level at the output of each of the output channels is also +30 dBm, given a nominal signal input of −20 dBm. The residual noise of the dynamic range tester system 100, which is the noise in common to both of the channel one and two outputs, is approximately −45 dBm at a bandwidth of approximately 60 MHz. Since the noise is proportional to the bandwidth, a 20 MHz bandwidth would result in even less residual noise, by approximately 5 dB, or a level of −50 dBm.

Using a 60 MHz bandwidth, the minimum signal-to-noise ratio achievable in each of the channel one and channel two outputs of the dynamic range tester 100 is approximately −75 dB. That result is achieved using a signal power of approximately −45 dBm and a noise power of approximately +30 dBm. Once such a S/N ratio is set up in each of the dynamic range tester 100 outputs, the dynamic range tester 100 of the present invention can be used to evaluate correlator processing gain of up to approximately 150 dB.

Figure 6A:
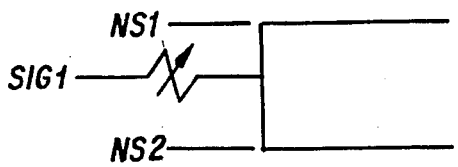
FIGS. 6A—6C are diagrams showing the various configurations for the dynamic range tester shown in FIG. 1.
Figure 6B:
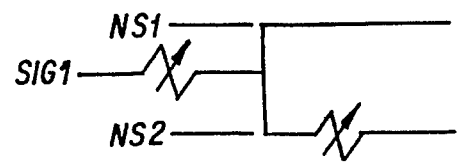
Figure 6C:
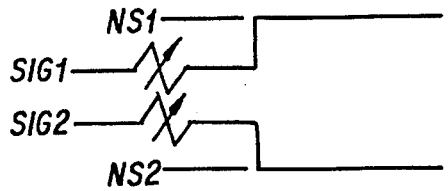

Referring now to FIGS. 6A—6C, there is shown the various options for configuring the dynamic range tester 100 of the present invention. In all of the cases the noise power levels one and two in the output channels one and two, respectively are independently variable and isolated from each other. FIG. 6A shows the use of only a first signal which is split and combined with each of the two separately generated noise signals one and two in order to produce two separate real signals. The two noise signal levels are independently variable. Those signals provide a simulation of two separate receiving antennas. Each of those two separate real signals contains an equal level of the input signal 1 and may be used to test the response of an acousto-optic or RF system to real-signals in a laboratory.

FIG. 6B shows a diagram in which a single input signal 1 is utilized together with two independent noise sources one and two similarly as shown in FIG. 6A and discussed above and in which the level of the input signal 1 in the output channel two can be varied independently of the input signal in the output channel one by means of a variable attenuator, 148, between the signal input 1 and the output channel two.

FIG. 6C shows a diagram of how two separate signals one and two, which can be independently controlled, are applied to the dynamic range tester 100 and used with the generated noise signals one and two in order to provide two output signals that can differ in both frequency and amplitude. It should be noted that, as shown in FIGS. 6A—6C, each of the noise channels contains a variable attenuator in order to control the noise power in each of the outputs of the dynamic range tester 100 in an independent manner.

Figure 2:
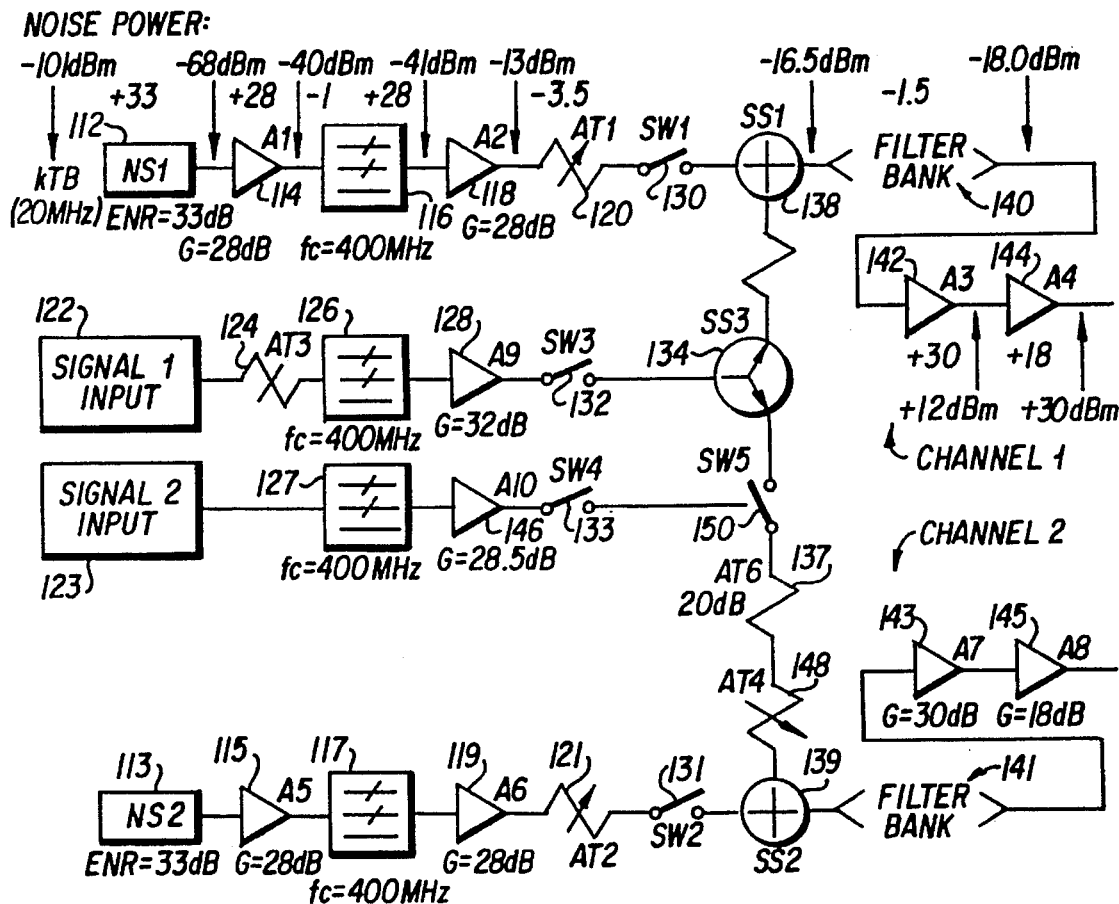
FIG. 2 is a schematic block diagram showing the flow of noise power through the dynamic range tester of FIG. 1 for a minimum of 20 MHz bandwidth.
Figure 3:
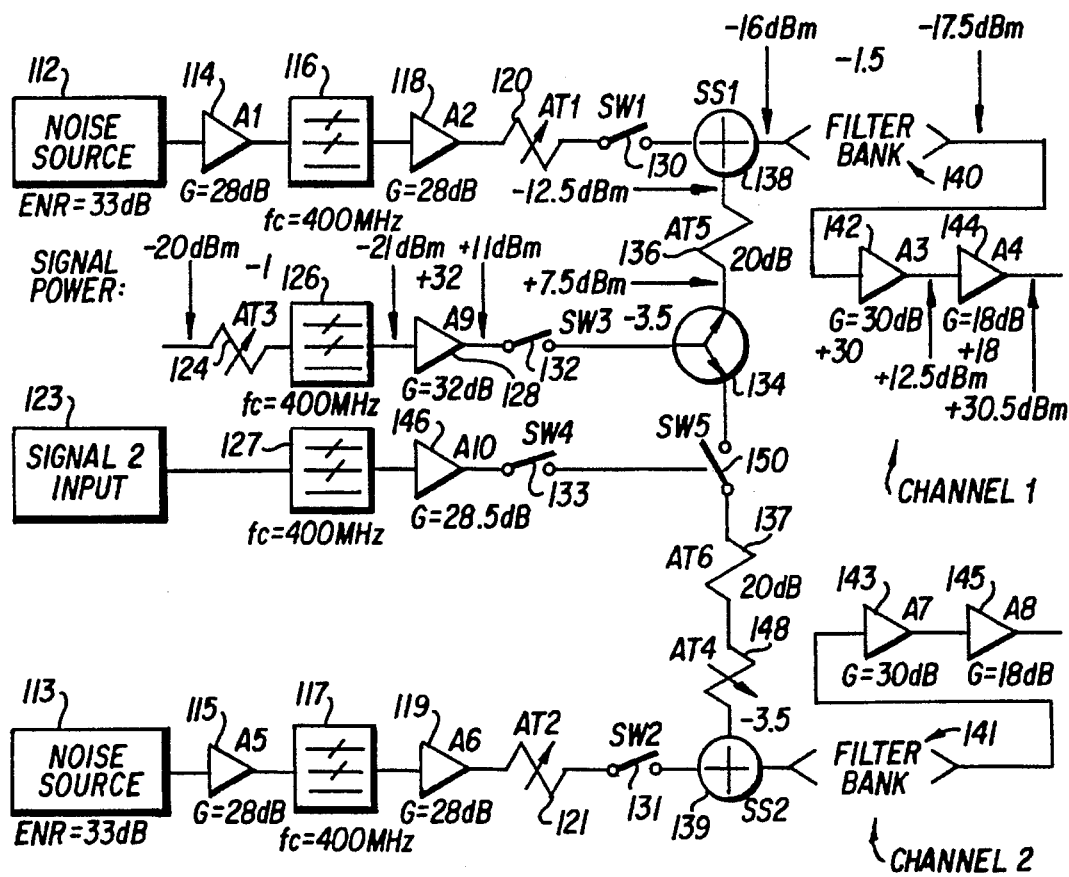
FIG. 3 is a schematic block diagram showing the flow of the signal power through the dynamic range tester of FIG. 1.

FIGS. 2 and 3 show, respectively, the flow of noise power and signal power through the dynamic range tester 100 of the present invention. The noise flow shown in FIG. 2, when the noise bandwidth is 20 MHz, produces the maximum 1 Watt output from each channel. As the bandwidth of the noise increases, so does the thermal noise. If a larger bandwidth than 20 MHz is selected in or connected to the filter banks 140, 141, then the variable attenuators 120, 121 are set accordingly to produce a 1 Watt output from each channel. While it is possible to obtain noise power greater than 1 Watt, under certain conditions, such noise power level cannot be linearly quantified because the internal amplifiers 142, 143 and 144, 145 might be operating beyond their linear response region.

FIG. 3 illustrates the signal power flow through the dynamic range tester 100 of the present invention for the first signal. As previously discussed, the selector switch 150 selects between inputting the processed signal 1 into both of the channels one and two or inputting the processed signals 1 and 2 into their respective channels one and two. Both of the signals 1 and 2 experience a 50 dB of gain from the input of the dynamic range tester 100 to their output at the channel one or channel two output. The amplifier 146 in the input circuitry of the signal 2 input circuit is 3.5 dB smaller than the corresponding amplifier 128 in the signal 1 circuitry in order to compensate for the fact that the second signal does not go through the splitter 134 where the first signal loses 3.5 dB. The variable attenuator 148 affects the signal in channel 2. When configuring the dynamic range tester as in FIG. 6A, the attenuator 148 should be set to zero. When configuring the dynamic range tester as in FIG. 6B, the variable attenuator 148 controls the level of the signal in channel two.

Figure 4:
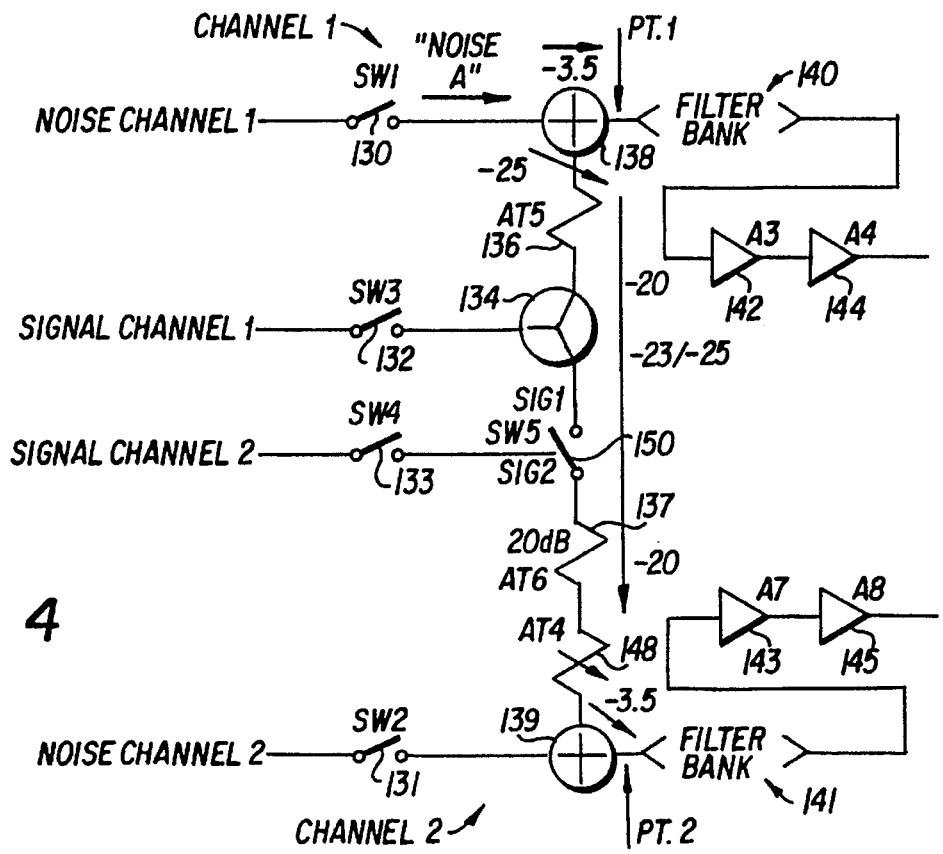
FIG. 4 is a schematic block diagram showing the isolation between the two noise channels of the dynamic range tester of FIG. 1.

As shown in FIG. 4, the isolation between the two noise channels one and two and the dynamic range tester 100 of the present invention is 88 to 90 dB. Such isolation is achieved by the dynamic range tester 100 of the present invention because of the configuration of the attenuators and the other components in any possible RF path between the two separately generated and independent noise signals.

Figure 5:
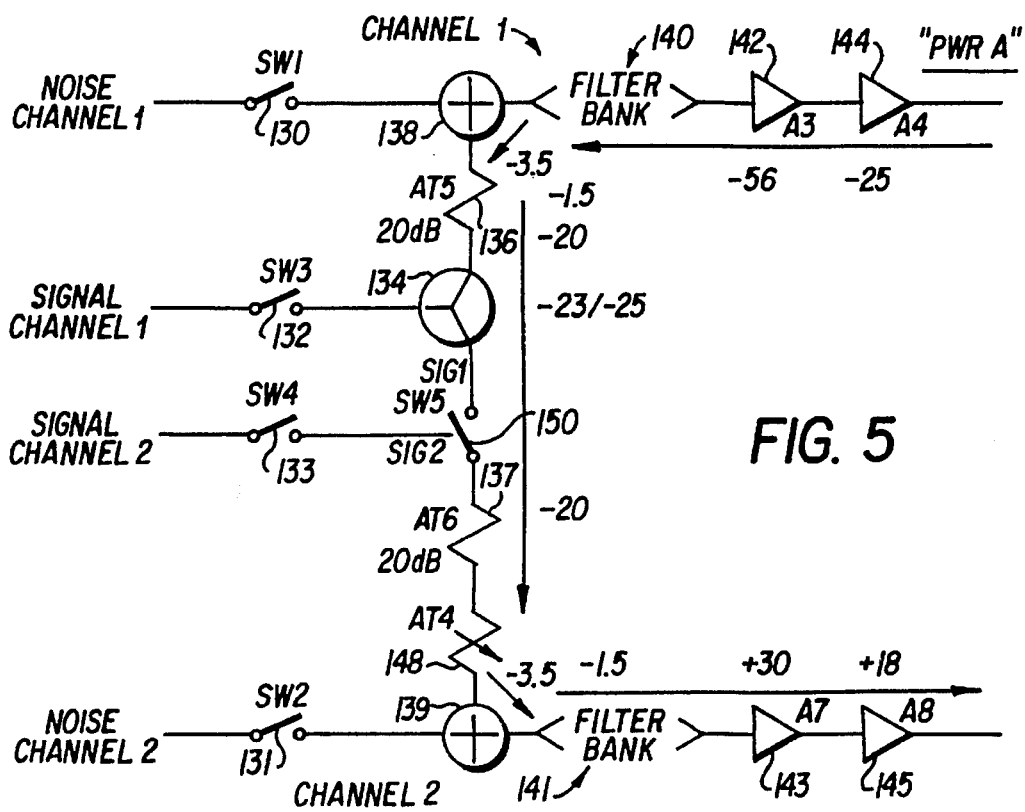
FIG. 5 is a schematic block diagram showing the output-to-output isolation between the two channels of the dynamic range tester of FIG. 1.

FIG. 5 is a schematic block diagram showing the output isolation between the channels one and two of the dynamic range tester 100. As shown in FIG. 5, the isolation between the channels one and two is 106 dB when the switch 132 is in its off position and 108 dB when the switch 132 is in its on position. That is because the isolation of the splitter 134 is 2 dB greater when the switch 132 is in its on position. Those high values demonstrate that the dynamic range tester 100 of the present invention achieves the desired isolation between channels such that the common signal from one output channel leaking back through the dynamic range tester 100 to the other output of the other channel is suppressed far enough so as not to corrupt the independence and isolated nature of the signals in the two outputs of the dynamic range tester in order to achieve a high dynamic range or high processing gain measurement of the device under test.

Although only a preferred embodiment is specifically illustrated and described herein, it will be appreciated that many modifications and variations including the range of operating frequencies and the bandwidth of the present invention are possible in light of the above teachings and within the purview of the appended claims without departing from the spirit and intended scope of the invention.

What is claimed is:

1. A signal-to-noise generator for use in evaluating the dynamic range of a system, comprising:

a signal input for receiving a user input signal;

a signal splitter connected to said input for creating first and second user input signals from said user input signal;

first and second noise signal generating means for generating first and second noise signals; and first and second combining means for combining said respective first user input and first noise signals and said second user input and second noise signals to form respective first and second output signals for use in evaluating the dynamic range of a system.

2. The generator of claim 1, wherein said first and second noise signal generating means are contained in separate shielded enclosures.

3. The generator of claim 1, further comprising a low pass filter connected between said user input signal and said signal splitter.

4. The generator of claim 1, further including an amplifier and a low pass filter connected between each respective first and second noise signal generating means and said first and second combining means.

5. The generator of claim 1, wherein said signal-to-noise generator has an operating frequency range of between 30 MHz and 400 MHz.

6. The generator of claim 1, further including respective means for independently attenuating said first and second noise signals, said means for independently attenuating being connected between respective said first and second noise signal generating means and said first and second combining means.

7. The generator of claim 1, further including means connected between said signal splitter and said second combining means for attenuating said second user input signal.

8. The generator of claim 7 wherein the configuration of said attenuators, said splitters, and said combiners in an), possible RF path between said first and said second output signals provides an isolation of approximately 88 dB, in order to achieve a high dynamic range measurement of a device under test.

* * * * *